United States Patent
Kawaguchi et al.

(10) Patent No.: US 6,881,525 B2
(45) Date of Patent: Apr. 19, 2005

(54) METHOD OF MANUFACTURING COLOR-CONVERTING FILTER

(75) Inventors: Koji Kawaguchi, Nagano (JP); Makoto Kobayashi, Nagano (JP); Kenya Sakurai, Nagano (JP)

(73) Assignee: Fuji Electric Holdings Co., Ltd., Tokyo (JP)

(*) Notice: Subject to any disclaimer, the term of this patent is extended or adjusted under 35 U.S.C. 154(b) by 0 days.

(21) Appl. No.: 10/795,794

(22) Filed: Mar. 8, 2004

(65) Prior Publication Data

US 2004/0241560 A1 Dec. 2, 2004

(30) Foreign Application Priority Data

Apr. 1, 2003 (JP) ........................................ 2003-098553

(51) Int. Cl.[7] .............................. G02F 1/23; G02B 5/20
(52) U.S. Cl. .......................... 430/7; 430/333; 430/334
(58) Field of Search ........................... 430/7, 321, 333, 430/334, 339

(56) References Cited

U.S. PATENT DOCUMENTS

2002/0071071 A1 * 6/2002 Sekiguchi et al. .......... 349/106

FOREIGN PATENT DOCUMENTS

| JP | 11-279426 A | * | 10/1999 |
| JP | 2000-012217 A | * | 1/2000 |
| JP | 2000-44824 A | * | 2/2000 |
| JP | 2001-164245 A | * | 6/2001 |
| JP | 2002-231450 A | * | 8/2002 |
| JP | 2003-229261 A | * | 8/2004 |

* cited by examiner

Primary Examiner—John A. McPherson
(74) Attorney, Agent, or Firm—Rossi, Kimms & McDowell

(57) ABSTRACT

A simplified method of manufacturing a color-converting filter is disclosed which permits highly detailed patterning. Color filter layers are formed on a transparent substrate, a colorant layer containing a color-converting colorant is formed on the color filter layers, and the colorant layer is exposed via the transparent substrate and the color filter layers using colorant-decomposing light. Color-converting layers are formed in positions corresponding to the color filter layers. The color-converting colorant is decomposed by light outside the wavelength region transmitted by the color filter layers. The colorant-decomposing light contains a wavelength component that decomposes the color-converting colorant, and the color-converting layers emit, through wavelength distribution conversion, light that will be transmitted by the color filter layers.

17 Claims, 4 Drawing Sheets

METHOD OF MANUFACTURING COLOR-CONVERTING FILTER

BACKGROUND OF THE INVENTION

The present invention relates to a method of manufacturing a color-converting filter that enables multi-color display. The color-converting filter can be used for display in image sensors, personal computers, word processors, televisions, facsimiles, audio equipment, video equipment, car navigation equipment, desk-top electronic calculators, telephones, mobile terminal equipment, industrial measuring equipment, and so on.

In recent years, as one method of achieving multi-color or full-color display, a color conversion method in which color-converting colorants that absorb near ultraviolet light, blue light, blue/green light or white light, carry out wavelength distribution conversion, and emit light in the visible region are used as filters has been studied (see Japanese Patent Application Laid-open Nos. 8-279394 and 8-286033). In the case of using the color conversion method, the color of the light emitted by the light source is not limited to being white, and hence the degree of freedom of selection of the light source can be increased. For example, an organic EL light emitter that emits blue light can be used, and green and red light can be obtained through the wavelength distribution conversion. The possibility of constructing a full-color luminescent-type display for which a light source having improved efficiency can be used, and moreover even low-energy radiation such as near ultraviolet light or visible light can be used, has been studied (see Japanese Patent Application Laid-open No. 9-80434).

An important problem in terms of practical application to a color display is providing a color-converting filter that enables detailed color display and is stable in terms of color fidelity and so on over a prolonged period, and moreover has high color conversion efficiency. However, if the concentration of the color-converting colorants is increased to increase the color conversion efficiency, then a drop in the efficiency due to so-called concentration quenching, and decomposition of the color-converting colorants over time and so on will occur. Therefore, currently the desired color conversion efficiency is obtained by increasing the thickness of the color-converting layers containing the color-converting colorants. Introduction of a bulky substituent onto the colorant nucleus has been studies as a way of preventing concentration quenching and decomposition of color-converting colorants (see Japanese Patent Application Laid-open Nos. 11-279426, 2000-44824, and 2001-164245). Moreover, addition of a quencher has been studies as a means of preventing decomposition of color-converting colorants (see Japanese Patent Application Laid-open No. 2002-231450).

In order to increase the level of detail of a multi-color or full-color display that uses the color conversion method, it is necessary to carry out highly detailed patterning of the color-converting layers. However, in cases where the width of each line in the pattern is less than the film thickness of the color-converting layers, the reproducibility of the pattern shape, and deformation of the pattern during subsequent manufacturing steps become problems. In addition, in the case where patterning is carried out using ordinary photolithography, an application step, an exposure step carried out while aligning the mask, and a developing step are required for each color of color-converting layers. Thus, in order to obtain a full-color display, at least red, green and blue color-converting layers are required, and hence the manufacturing process requires many steps, and is complex.

SUMMARY OF THE INVENTION

It is therefore an object of the present invention to provide a method of manufacturing a color-converting filter in which the manufacturing process is simplified, yet highly detailed patterning is possible.

In accordance with these and other objects of the invention, a method of manufacturing a color-converting filter according to a first embodiment of the present invention comprises forming color filter layers on a transparent substrate, forming a colorant layer containing a color-converting colorant on the color filter layers, and exposing the colorant layer through the transparent substrate and the color filter layers using colorant-decomposing light, to form color-converting layers in positions corresponding to the color filter layers, wherein the color-converting colorant is decomposed by light outside a wavelength region transmitted by the color filter layers, the colorant-decomposing light contains a wavelength component that decomposes the color-converting colorant, and the color-converting layers emit, through wavelength distribution conversion, light that will be transmitted by the color filter layers. The colorant-decomposing light may be white light.

A method of manufacturing a color-converting filter according to a second embodiment of the present invention comprises forming color filter layers of n types on a transparent substrate, forming a colorant layer containing color-converting colorants of n–1 types on the color filter layers of the n types, and exposing the colorant layer through the transparent substrate and the color filter layers using colorant-decomposing light, thus forming color-converting layers of an $m^{th}$ type in positions corresponding to the color filter layers of the $m^{th}$ type, wherein n represents an integer from 2 to 6, and m takes on the values of all integers from 1 to n–1, each of the n types of the color filter layers transmits light in a different wavelength region, the $m^{th}$ type of the color-converting colorants is decomposed by light not transmitted by the color filter layers of the $m^{th}$ type, and the color-converting layers of the $m^{th}$ type emit, through wavelength distribution conversion, light that will be transmitted by the color filter layers of the $m^{th}$ type. Here, it is preferable for the color filter layers of the $(m+1)^{th}$ type to transmit light of a shorter wavelength than the color filter layers of the $m^{th}$ type, and for the $m^{th}$ type of the color-converting colorants to be decomposed by light of a shorter wavelength than the light transmitted by the color filter layers of the $m^{th}$ type. The colorant-decomposing light is preferably light containing wavelength components that together decompose all of the n–1 types of the color-converting colorants, and is more preferably white light. Alternatively, exposure may be carried out a plurality of times, with a wavelength component that decomposes the $m^{th}$ type of the color-converting colorants being contained in the colorant-decomposing light used in at least one of the plurality of exposures. More preferably, exposure is carried out n–1 times, with the $m^{th}$ exposure being carried out using light containing the wavelength component that decomposes the $m^{th}$ type of the color-converting colorants.

In the second embodiment, the colorant layer further may contain an $n^{th}$ type of color-converting colorant, color-converting layers of the $n^{th}$ type are formed through the exposure in positions corresponding to the color filter layers of the $n^{th}$ type, the $n^{th}$ type of the color-converting colorants is decomposed by light not transmitted by the color filter layers of the $n^{th}$ type, and the $n^{th}$ type of the color-converting colorants emits, through wavelength distribution conversion, light that will be transmitted by the color filter layers of the $n^{th}$ type. Here, it is preferable for the color filter layers of the $(m+1)^{th}$ type to transmit light of a shorter wavelength than the color filter layers of the $m^{th}$ type, for the $m^{th}$ type of the color-converting colorants to be decomposed by light of a shorter wavelength than the light transmitted by the color filter layers of the $m^{th}$ type, and for the $n^{th}$ type of the color-converting colorants to be decomposed by light of a shorter wavelength than the light transmitted by the color filter layers of the $n^{th}$ type. The colorant-decomposing light preferably is light containing wavelength components that together decompose all of the n−1 types of the color-converting colorants, and is more preferably white light containing a near ultraviolet component. Alternatively, exposure may be carried out a plurality of times, with a wavelength component that decomposes the $k^{th}$ type of the color-converting colorants being contained in the colorant-decomposing light used in at least one of the plurality of exposures, wherein k takes on the values of all integers from 1 to n. More preferably, exposure is carried out n times, with the $k^{th}$ exposure being carried out using light containing the wavelength component that decomposes the $k^{th}$ type of the color-converting colorants.

DETAILED DESCRIPTION OF PREFERRED EMBODIMENTS

Figure 1A:
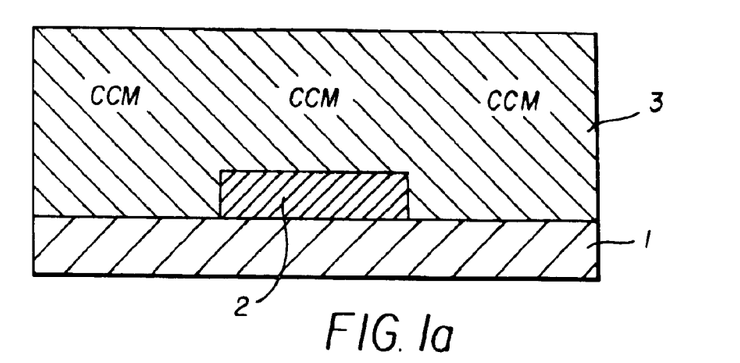
FIGS. 1(a)–(c) are schematic drawings showing a method of manufacturing a color-converting filter according to a first embodiment of the present invention.

FIG. 1 shows a first embodiment of a method of manufacturing a color-converting filter according to the present invention. FIG. 1(a) shows a laminate in which color filter layer 2, and colorant layer 3 containing a color-converting colorant (CCM) have been provided on a transparent substrate 1. Although only a single color filter layer 2 and a single colorant layer 3 are shown for simplicity, plural layers 2 and 3 are encompassed by the invention, and are formed repeatedly in a pattern over transparent substrate 1.

Transparent substrate 1 must be transparent to visible light (wavelength 400 to 700 nm), preferably to light that has been subjected to conversion by color-converting layer 4. Here again, while a single color-converting layer 4 has been shown in FIG. 1, plural color-converting layers 4 are included within the scope of the invention. Transparent substrate 1 should be able to withstand the conditions (solvents, temperature, etc.) used when forming the color-converting layers 4 and other layers that are provided as required (described later), and moreover preferably has excellent dimensional stability. Preferable materials for transparent substrate 1 include glasses, and resins such as polyethylene terephthalate and polymethylmethacrylate. A borosilicate glass, a blue plate glass or the like is particularly preferable.

Figure 1B:
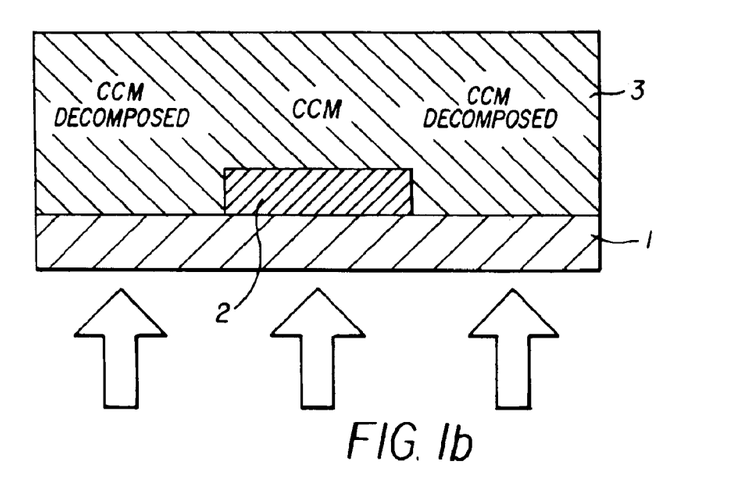

Color filter layers 2 are layers that transmit only light in a desired wavelength region. In the completed color-converting filter, color filter layers 2 are effective in blocking light from a light source that has not been subjected to wavelength distribution conversion by color-converting layers 4, and moreover in improving the color purity of the light that has been subjected to wavelength distribution conversion by color-converting layers 4. In addition, color filter layers 2 in the present embodiment function as a mask when patterning colorant layer 3 to form color-converting layers 4 in step (b) described below. Color filter layers 2 contain a colorant and a photosensitive resin. It is preferable to use a pigment having high light-fastness as the colorant. Photosensitive resins include, for example, (1) compositions comprising an acrylic polyfunctional monomer or oligomer having a plurality of acryloyl groups or methacryloyl groups and a photopolymerization initiator, (2) compositions comprising a polyvinyl cinnamic acid ester and a sensitizer, and (3) compositions comprising a chain or cyclic olefin and a bisazide (a nitrene is generated, and the olefin is crosslinked). The color filter layers also may be formed, for example, using a commercially sold color filter material for liquid crystals (e.g. a Color Mosaic made by Fujifilm Arch Co., Ltd.).

Color filter layers 2 have a thickness of about 1 to 2.5 $\mu$m, preferably about 1 to 1.5 $\mu$m, although this depends on the colorant content. By thus controlling the thickness, highly detailed patterning becomes possible, and it becomes possible to obtain a transmission spectrum such that color filter layers 2 function sufficiently as both a mask in step (b) and a filter in the completed color-converting filter.

Colorant layer 3 is a layer that comprises a color-converting colorant and a matrix resin. The color-converting colorant is a colorant that subjects incident light to wavelength distribution conversion and emits light in a wavelength region transmitted by color filter layers 2, and is preferably a colorant that subjects near ultraviolet light or blue to blue/green light to wavelength distribution conversion and emits light in a wavelength region transmitted by color filter layers 2 (e.g., blue, green or red). If desired, the color-converting colorant may also carry out wavelength distribution conversion within the range of the wavelength region transmitted by color filter layers 2. Moreover, the color-converting colorant is selected from colorants that are decomposed by light transmitted by transparent substrate 1, but are not decomposed by light transmitted by color filter layers 2. It is important that colored decomposition products are not produced when the colorant is decomposed by light transmitted by transparent substrate 1. In particular, a strong requirement is that there is no absorption in the wavelength region obtained through the wavelength distribution conversion. The reason for this is that if there is absorption of light in this wavelength region, then there will be a drop in the light conversion efficiency. Moreover, even if there is no absorption of light in this wavelength region, colored decomposition products will cause unwanted coloration of the color-converting filter obtained, and are thus undesirable.

Color-converting colorants that absorb light in the blue to blue/green region and emit red light include, for example, rhodamine type colorants such as Rhodamine B, Rhodamine 6G, Rhodamine 3B, Rhodamine 101, Rhodamine 110, sulforhodamines, Basic Violet 11 and Basic Red 2, cyanine type colorants, pyridine type colorants such as 1-ethyl-2-[4-(p-dimethylaminophenyl)-1,3-butadienyl]-pyridinium perchlorate (Pyridine 1), and oxazine type colorants.

Color-converting colorants that absorb light in the blue to blue/green region and emit green light include, for example, coumarin type colorants such as 3-(2'-benzothiazolyl)-7-diethylaminocoumarin (Coumarin 6), 3-(2'-benzoimidazolyl)-7-diethylaminocoumarin (Coumarin 7), 3-(2'-N-methylbenzoimidazolyl)-7-diethylaminocoumarin (Coumarin 30) and 2,3,5,6-1H,4H-tetrahydro-8-trifluoromethylquinolizino-(9,9a,1-gh)coumarin (Coumarin 153), and Basic Yellow 51, which is a coumarin colorant type dye, and also naphthalimide type colorants such as Solvent Yellow 11 and Solvent Yellow 116.

Examples of fluorescent colorants that absorb light in the near ultraviolet or visible region and emit blue light include coumarin type colorants such as Coumarin 466, Coumarin 47, Coumarin 2 and Coumarin 102.

Other than the above-mentioned colorants, any of various dyes (direct dyes, acid dyes, basic dyes, disperse dyes, etc.) can be used, provided that (1) the dye can carry out the desired wavelength distribution conversion, (2) the dye is decomposed by light transmitted by transparent substrate 1, but is not decomposed by light transmitted by the color filter layers 2, and (3) colored decomposition products are not produced when the dye is decomposed by light.

Matrix resins include, for example, polymethacrylic acid esters, polyvinyl chloride, vinyl chloride-vinyl acetate copolymer resins, alkyd resins, aromatic sulfonamide resins, urea resins, melamine resins, benzoguanamine resins, and mixtures of such resins.

In the present invention, it is preferable to use at least about 0.2 µmol, more preferably about 1 to 20 µmol, and most preferably about 3 to 15 µmol, of the color-converting colorant per 1 g of the matrix resin used. Moreover, colorant layer 3, comprising color-converting layers 4 and flattening layer 5, has a thickness of at least about 5 µm, and preferably about 7 to 15 µm. As a result, color-converted output light of a desired intensity can be obtained. Furthermore, if desired, the colorant layer 3 may contain a plurality of colorants.

In an exposure step of FIG. 1(b), exposure with light is carried out from the transparent substrate side such that the light passes through color filter layers 2 and reaches colorant layer 3. The light used in the exposure contains a wavelength component that decomposes the colorant contained in colorant layer 3 but is absorbed by color filter layers 2. For example, in the case of manufacturing red color-converting layers 4, color filter layers 2 are red, and light containing a wavelength component below 600 nm is used in the exposure. Similarly, in the case of manufacturing green color-converting layers 4, color filter layers 2 are green, and light containing a wavelength component below 500 nm is used in the exposure. Furthermore, in the case of manufacturing blue color-converting layers 4, color filter layers 2 are blue, and light or near ultraviolet radiation containing a wavelength component below 400 nm is used in the exposure. In each of the cases, the exposure may also be carried out using white light containing the above-mentioned wavelength component.

The light used for exposure should have an intensity considerably higher than the intensity of the light that will be used in the wavelength distribution conversion carried out by the formed color-converting filter. It is preferable to use light having an intensity of at least about 0.05 W/cm², more preferably at least about 1 W/cm², at the surface of transparent substrate 1 on which the light is incident, although this will depend on the color-converting colorant used and so on. The exposure time will depend on the desired extent of decomposition of the color-converting colorant, and is a matter that can be determined as appropriate by a person skilled in the art. By using light having a high intensity in this way, the color-converting colorant can be decomposed in the desired regions.

Any light source known in the technical field in question may be used, for example a halogen lamp, a metal halide lamp, an incandescent lamp, an electric discharge lamp, a mercury lamp, or a laser. In each case, however, a light source that satisfies the wavelength requirements described above should be selected.

Figure 1C:
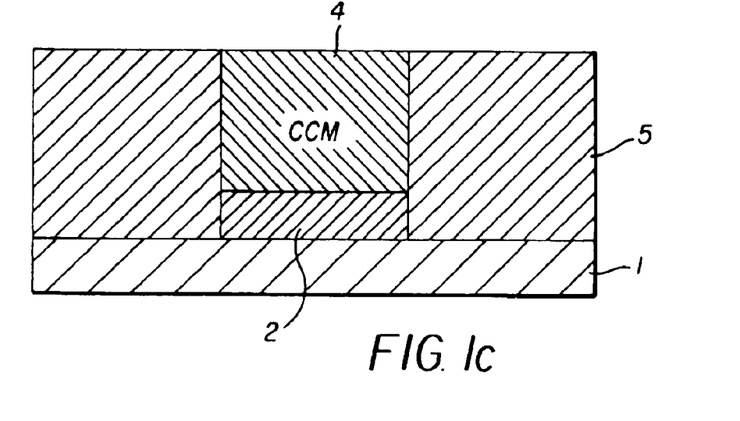

When the exposure described above is carried out, decomposition of the color-converting colorant does not occur in the region above each of color filter layers 2, but does occur in regions where no color filter layer 2 is provided. As a result, as shown in FIG. 1(c), color-converting layer 4 is formed above each of color filter layers 2, and colorless flattening layer 5 not containing the color-converting colorant is formed in the regions where no color filter layer 2 is provided. Note that in the present embodiment, color-converting layers 4 have the same composition as the originally formed colorant layer 3.

A method of manufacturing a color-converting filter according to a second embodiment of the present invention comprises forming color filter layers of n types on a transparent substrate, forming a colorant layer containing color-converting colorants of n−1 types on the color filter layers of the n types, and exposing the colorant layer through the transparent substrate and the color filter layers using colorant-decomposing light, thus forming color-converting layers of an $m^{th}$ type in positions corresponding to the color filter layers of the $m^{th}$ type, wherein n represents an integer from 2 to 6, and m takes on the values of all integers from 1 to n−1; each of the n types of color filter layers transmits light in a different wavelength region, the $m^{th}$ type of the color-converting colorants is decomposed by light not transmitted by the color filter layer of the $m^{th}$ type, and the color-converting layers of the $m^{th}$ type emit, through wavelength distribution conversion, light that will be transmitted by the color filter layers of the $m^{th}$ type. The case for n=3 is shown in FIG. 2.

Figure 2A:
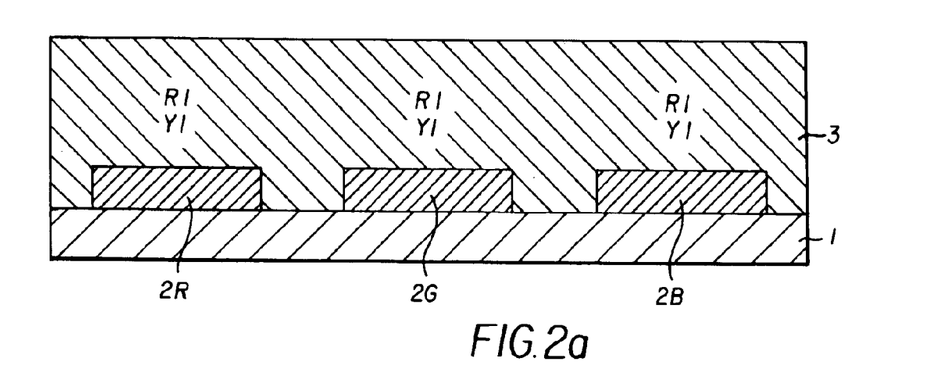
FIGS. 2(a) and 2(b) are schematic drawings showing a method of manufacturing a color-converting filter according to a second embodiment of the present invention.

FIG. 2(a) shows a laminate in which first (red) color filter layers 2R, second (green) color filter layers 2G, third (blue) color filter layers 2B, and colorant layer 3 containing a first color-converting colorant R1 and a second color-converting colorant Y1 are provided on transparent substrate 1.

The first color-converting colorant R1 is a colorant that emits red light through wavelength distribution conversion, preferably a colorant that subjects near ultraviolet light or blue to blue/green light to wavelength distribution conversion and emits red light (within a wavelength range of 600 to 700 nm). Moreover, the first color-converting colorant R1 is decomposed by light containing a wavelength component below 600 nm. The second color-converting colorant Y1 is a colorant that emits green light (within a wavelength range of 500 to 600 nm) through wavelength distribution conversion, preferably a colorant that subjects near ultraviolet light or blue to blue/green light to wavelength distribution conversion and emits green light. Moreover, the second color-converting colorant Y1 is decomposed by light containing a wavelength component below 500 nm. The various constituent elements of the laminate of the present embodiment, including the color-converting colorants, can be formed using materials as described in the first embodiment.

Figure 2B:
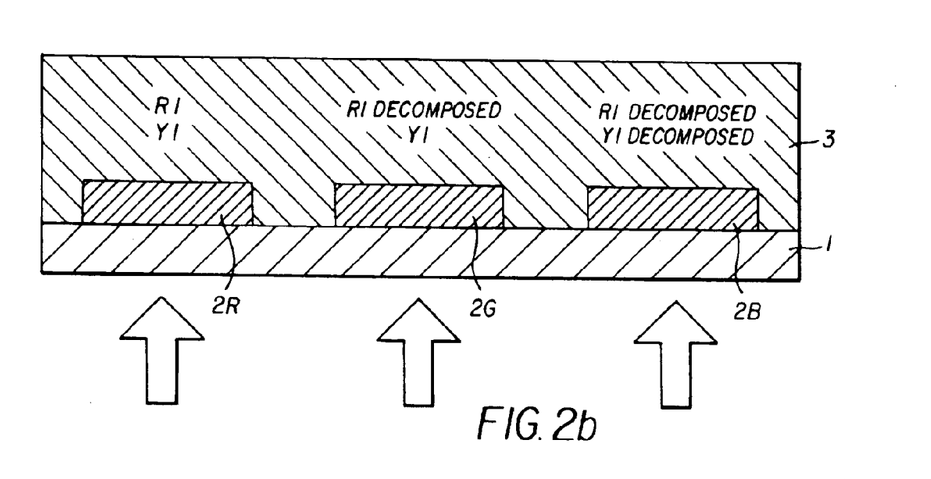

FIG. 2(b) shows an exposure step in which exposure with light is carried out through transparent substrate 1 and color filter layers 2 of the plurality of types. The light used in the exposure contains at least components that together decompose the red color-converting colorant R1 and the green color-converting colorant Y1, specifically a wavelength component of 500 to 600 nm, and a wavelength component below 500 nm. The exposure may also be carried out using white light containing these wavelength components.

During the exposure, red color filter layers 2R do not transmit wavelength components below 600 nm, and hence neither the red color-converting colorant R1 or the green color-converting colorant Y1 is decomposed in parts of the colorant layer 3 positioned above red color filter layers 2R. Red color-converting layers 4R containing R1 and Y1 are thus formed above red color filter layers 2R. In the present embodiment, the wavelength distribution conversion into red light in red color-converting layers 4R may be carried out by the red color-converting colorant R1 only. Alternatively, green light emitted by the green color-converting colorant Y1 may be subjected to wavelength distribution conversion into red light by the red color-converting colorant R1.

The green color filter layers 2G transmit the wavelength component of 500 to 600 nm, but do not transmit the wavelength component below 500 nm. Consequently, in parts of colorant layer 3 positioned above green color filter layers 2G, the red color-converting colorant R1 is decomposed by the wavelength component of 500 to 600 nm, but the green color-converting colorant Y1 is not decomposed. Green color-converting layers 4G containing Y1 are thus formed above the green color filter layers 2G. In the present embodiment, wavelength distribution conversion into green light in the green color-converting layers 4G is carried out by only the green color-converting colorant Y1.

The blue color filter layers 2B transmit a wavelength component below 400 to 500 nm. Consequently, in the parts of colorant layer 3 positioned above blue color filter layers 2B, the red color-converting colorant R1 and the green color-converting colorant Y1 are both decomposed by the wavelength component of 400 to 500 nm. In the example shown in FIG. 2, layers 4B formed above blue color filter layers 2B contain no color-converting colorants.

The color-converting filter obtained through the exposure step described above is shown in FIG. 2(c). At parts where no color filter layer 2 is provided, the red color-converting colorant R1 and the green color-converting colorant Y1 are both decomposed by the wavelength component of 400 to 500 nm, and hence colorant layer 3 becomes a flattening layer 5 containing no color-converting colorants. If blue or blue/green light is irradiated onto the color-converting filter from the side of color-converting layers 4, then red light produced through the wavelength distribution conversion in red color-converting layers 4R is emitted via red color filter layers 2R, and green light produced through the wavelength distribution conversion in green color-converting layers 4G is emitted via green color filter layers 2G. Moreover, blue light is emitted via blue color filter layers 2B.

In the present embodiment, the content of the color-converting colorant(s) in color-converting layers 4, and the thickness of color-converting layers 4, are as in the first embodiment. Moreover, in the present embodiment, again each of color-converting layers 4 may contain a plurality of colorants.

In the present embodiment, colorant layer 3 may further contain a blue color-converting colorant B1 that emits blue light through wavelength distribution conversion of ultraviolet radiation or visible light. As the blue color-converting colorant B1, it is preferable to use a colorant that is decomposed by light or near ultraviolet radiation containing a wavelength component below 400 nm.

In the exposure step of FIG. 2(b), the blue color-converting colorant B1 is not decomposed in the parts of colorant layer 3 where color filter layers 2R, 2G and 2B are provided. Blue color-converting layers 4B thus come to contain the blue color-converting colorant B1. Moreover, color-converting layers 4R and 4G also come to further contain the blue color-converting colorant B1. In this case, the red color-converting colorant R1 and/or the green color-converting colorant Y1 may further subject the blue light emitted by the blue color-converting colorant B1 to wavelength distribution conversion. Furthermore, in the case that the light emitted by the light source used in the exposure contains a wavelength component below 400 nm, the blue color-converting colorant B1 will be decomposed in parts of colorant layer 3 where no color filter layer 2 is provided, and hence flattening layer 5 will come to contain no color-converting colorants. In the case that the light emitted by the light source does not contain a wavelength component below 400 nm, flattening layer 5 will come to contain the blue color-converting colorant B1.

A variation of the present embodiment is shown in FIG. 3. In FIG. 3, the color-converting filter is formed using two exposure steps. The laminate shown in FIG. 3(a) is the same as that shown in FIG. 2(a). In a first exposure step shown in FIG. 3(b), light containing a wavelength component of 500 to 600 nm is used. This wavelength component is transmitted by green color filter layers 2G, and thus decomposes the red color-converting colorant R1 in the parts of colorant layer 3 positioned above green color filter layers 2G. On the other hand, red color filter layer 2R and blue color filter layer 2B do not transmit this wavelength component, and hence the red color-converting colorant R1 is not decomposed in the parts of colorant layer 3 positioned above red and blue color filter layers 2R and 2B.

Figure 3A:
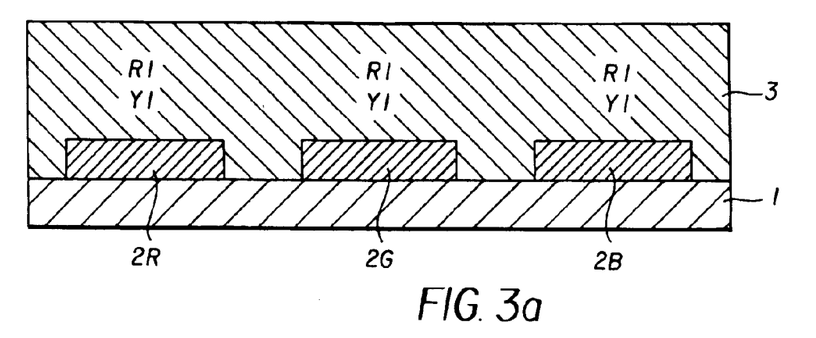
FIGS. 3(a)–(d) are schematic drawings showing a variation of the method of manufacturing a color-converting filter according to the second embodiment of the present invention.
Figure 3B:
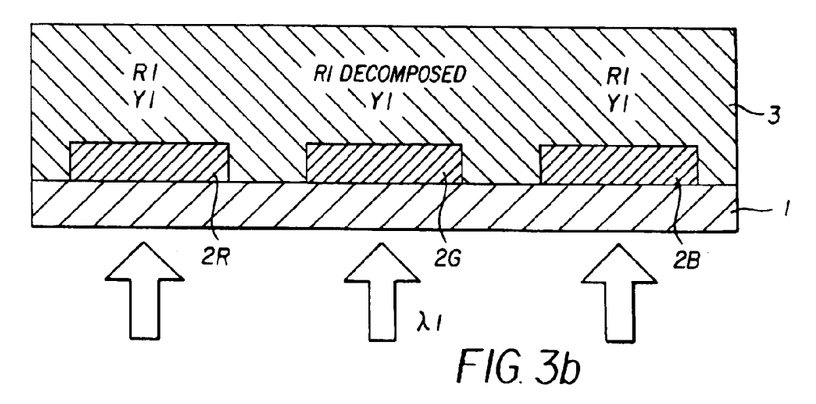
Figure 3C:
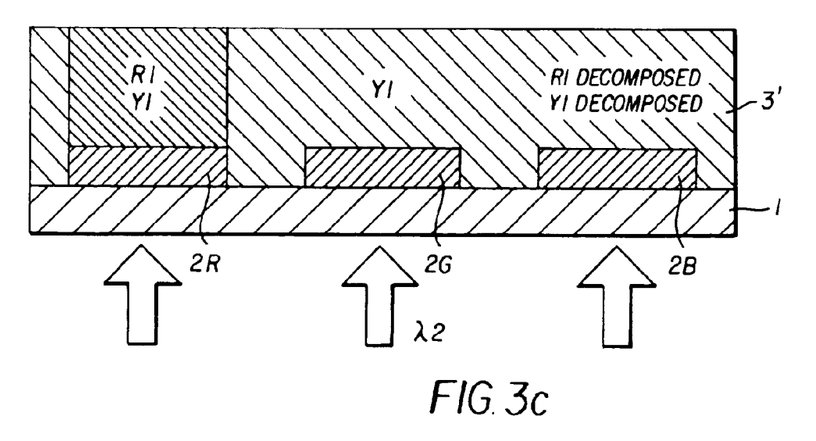

Next, in a second exposure step shown in FIG. 3(c), light containing a wavelength component of 400 to 500 nm is used. This wavelength component is transmitted by blue color filter layers 2B, and thus decomposes the red color-converting colorant R1 and the green color-converting colorant Y1 in the parts of colorant layer 3 positioned above blue color filter layers 2B. Red color filter layer 2R and green color filter layer 2G do not transmit this wavelength component, and hence the red color-converting colorant R1 and the green color-converting colorant Y1 are not decomposed in the parts of colorant layer 3 positioned above red and green color filter layers 2R and 2G.

Figure 2C:
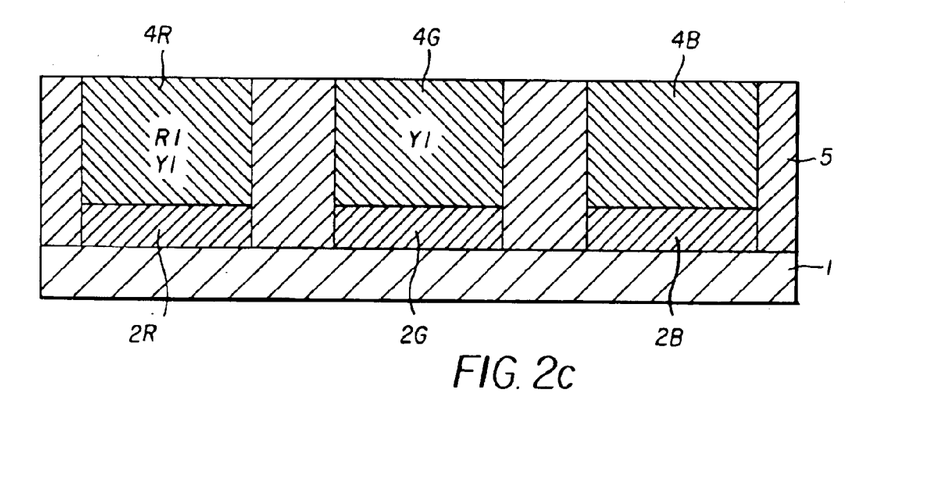
Figure 3D:
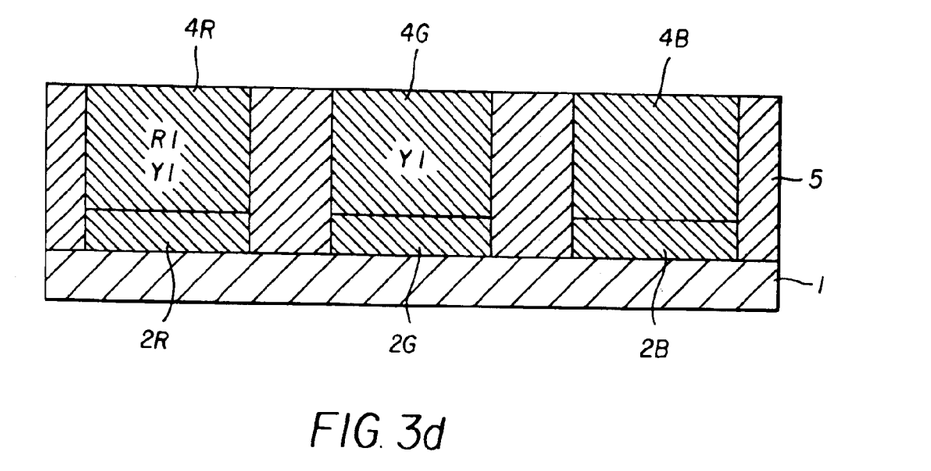

The color-converting filter shown in FIG. 3(d) obtained through the two exposure steps described above has the same structure as that shown in FIG. 2(c). In the present variation, the number of exposure steps is greater, but in each of the exposure steps, a light source having a narrower emission wavelength region and a higher intensity can be used. The time taken for each of the exposure steps can thus be shortened. Note that in the present variation, the order of the exposure steps is not fixed, but rather the exposure with the wavelength component of shorter wavelength may instead be carried out first.

Moreover, in the present variation, colorant layer 3 additionally may contain a blue color-converting colorant B1 that emits blue light through wavelength distribution conversion of ultraviolet radiation or visible light. In this case, blue color-converting layers 4B will come to contain the blue color-converting colorant B1.

As described above, according to the method of the present embodiment, a color-converting filter that gives the three colors red, green and blue necessary for full-color display can be obtained. By arranging a plurality of independently controllable light sources in positions corresponding to the positions of the color-converting layers, a multicolor display can thus be formed. Moreover, in the present embodiment, through self-alignment using as masks color filter layers 2 that are thin and can be formed to high detail, color-converting layers 4 can be formed in desired positions using a shorter manufacturing process. Furthermore, the matrix resin of color-converting layers 4 and flattening layer 5 constitutes a single integrated body, remaining as when formed as colorant layer 3, and hence even if color-converting layers 4 having a width that is narrow compared with the film thickness are formed, misshaping of color-converting layers 4 can be suppressed.

In the present embodiment, a description has been given for the case of forming color-converting layers of the three colors red, green and blue, but it should be understood that other colors may be used instead. Thus, if desired, 2 types of color-converting layers, 4 or more types of color-converting layers, and preferably 2 to 6 types of color-converting layers may be formed. In the case of forming 6 types of color-converting layers, taking the first to sixth color filter layers to transmit light in first to sixth wavelength regions that are in order from the longest wavelength downwards, and taking the first to fifth color-converting colorants to emit light by wavelength distribution conversion of wavelengths that are in order from the longest wavelength downwards, it is preferable to make things such that the first color-converting colorant is decomposed by light in the second wavelength region, the second color-converting colorant is decomposed by light in the third wavelength region, and so on up to the fifth color-converting colorant being decomposed by light in the sixth wavelength region. In the case of the colorant layer further containing a sixth color-converting colorant, it is preferable to make it such that the sixth color-converting colorant is not decomposed by light in any of the first to sixth wavelength regions. The cases of forming two to five types of color-converting layers are analogous to the above.

In the case of forming a plurality of types of color-converting layers 4, a color-converting filter for so-called area color display in which color-converting layers different to those in other regions are formed only in certain regions may be formed. Alternatively, a color-converting filter for display may be formed by taking red, green and blue color-converting layers 4 having, for example, a rectangular or circular shape as one set, and providing this set repeatedly in a matrix shape, or taking red, green and blue color-converting layers 4 that each have a stripe shape and are parallel to one another as one set, and providing this set repeatedly over the transparent substrate. Here, color-converting layers of a particular color can also be disposed to a greater degree, in terms of number or area, than the color-converting layers of the other colors. Alternatively, a plurality of color-converting layers may be arranged following a pattern, signs, characters, marks or the like, and these may be displayed. In yet another embodiment, a single color that could not be achieved using a single type of color-converting layer 4 may be displayed by using two types of color-converting layers 4 arranged with a suitable area ratio therebetween divided into very small regions.

A color-converting light-emitting device can be formed by combining a color-converting filter formed using the method of the present invention and a light source. A freely chosen light source that emits light from the near ultraviolet to visible region, preferably blue or blue/green light, can be used as the light-emitting part. Examples of such a light source include EL light-emitting devices, plasma light-emitting devices, cold cathode tubes, electric discharge lamps (high-pressure or ultra-high-pressure mercury lamps), light-emitting diodes (LEDs), and so on. The light-emitting part is disposed on the side of the color-converting layers 4. Alternatively, the light-emitting part may be laminated directly onto the color-converting filter formed using the method of the present invention. In the case of directly laminating on the light-emitting part, it is particularly advantageous that the upper surface of the color-converting filter formed using the method of the present invention is flat.

Figure 4:
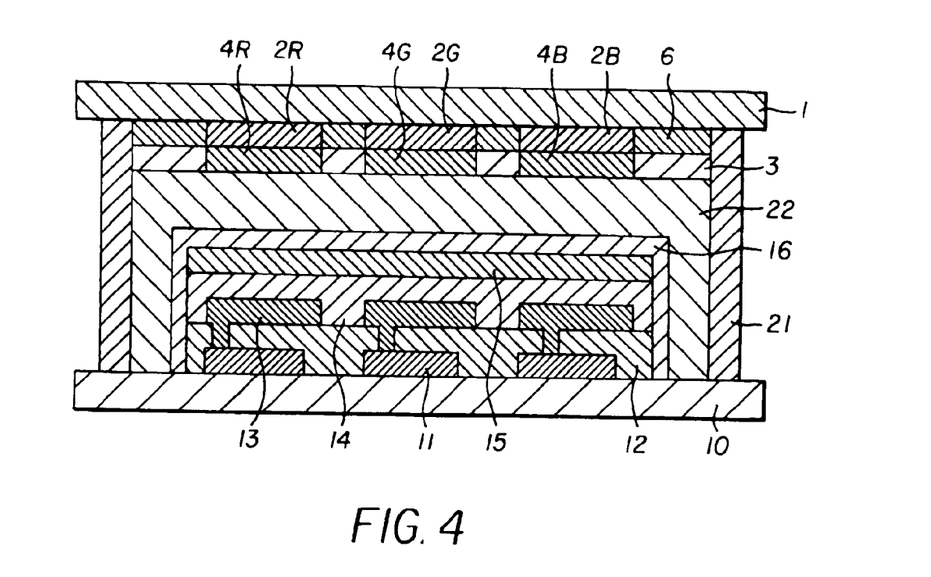
FIG. 4 is a schematic sectional drawing showing an example of a color-converting light-emitting device formed using a color-converting filter manufactured using the method of the present invention.

As an example of a color-converting light-emitting device according to the present invention, FIG. 4 shows a top emission type organic EL display formed by bonding the color-converting filter to an organic EL device. An organic EL device comprising flattening film 12, lower electrode 13, organic EL layer 14, upper electrode 15 and passivation layer 16 is formed on substrate 10 on which TFTs 11 have been formed as switching devices in advance. Lower electrode 13 is divided into a plurality of parts, and the parts are reflective electrodes that are connected one-to-one to TFTs 11; upper electrode 15 is a transparent electrode that is formed uniformly over the whole surface. The various layers constituting the organic EL device can be formed using materials and methods known in the technical field in question.

Blue, green and red color filter layers 2B, 2G and 2R, and blue, green and red color-converting layers 4B, 4G and 4R are formed on transparent substrate 1. Black mask 6 for improving contrast is formed between and around the color filter layers. In the example shown in FIG. 4, colorant layer 3 is thus present as originally formed with none of the colorants therein decomposed in positions corresponding to black mask 6, and functions as a flattening layer in these positions.

Next, the organic EL device and the color-converting filter are aligned and bonded together, with optional filler layer 22 being formed therebetween, and then finally peripheral parts are sealed using an outer periphery sealing layer (adhesive) 21, whereby the organic EL display is obtained. An active matrix driving type display has been shown in FIG. 4, but a passive matrix driving type organic EL device may of course be used instead.

Organic EL layer 14 emits light from the near ultraviolet to visible region, preferably light in the blue or blue/green region. This emitted light is incident on the color-converting filter layers, and is subjected to wavelength distribution conversion into visible light having the desired colors. Organic EL layer 14 has a structure comprising at least an organic light-emitting layer, and if necessary a hole injection layer, a hole transport layer, an electron transport layer, and/or an electron injection layer are interposed. Specifically, organic EL layer 14 having a layer structure such as the following is adopted.

(1) Organic light-emitting layer
(2) Hole injection layer/organic light-emitting layer
(3) Organic light-emitting layer/electron injection layer
(4) Hole injection layer/organic light-emitting layer/electron injection layer
(5) Hole injection layer/hole transport layer/organic light-emitting layer/electron injection layer
(6) Hole injection layer/hole transport layer/organic light-emitting layer/electron transport layer/electron injection layer In each of the above, the anode(s) is/are connected to the organic light-emitting layer or the hole injection layer, and the cathode(s) is/are connected to the organic light-emitting layer or the electron injection layer.

Commercially-available materials are used as the materials of the above-mentioned layers. To obtain luminescence from blue to blue/green in color, for example a fluorescent whitening agent of benzothiazole type, benzimidazole type, benzoxazole type or the like, a metal chelated oxonium compound, a styrylbenzene type compound, an aromatic dimethylidene type compound, or the like is preferably used in the organic light-emitting layer. Moreover, a phthalocyanine compound such as copper phthalocyanine, a triphenylamine derivative such as m-MTDATA, or the like can be used as the hole injection layer, and a biphenylamine derivative such as TPD or α-NPD, or the like can be used as the hole transport layer. Moreover, an oxadiazole derivative such as PBD, a triazole derivative, a triazine derivative, or the like can be used as the electron transport layer, and an aluminum quinolinol complex or the like can be used as the electron injection layer. Furthermore, an alkali metal, an alkaline earth metal, or an alloy containing an alkali metal or an alkaline earth metal, or an alkali metal fluoride, or the like may also be used as the electron injection layer.

EXAMPLE 1

A blue filter material (Color Mosaic CB-7001 made by Fujifilm Arch Co., Ltd.) was applied using a spin coating method onto transparent glass substrate 1, and patterning was carried out by photolithography, to form blue color filter layers 2B of thickness 2 μm in a pattern of lines running in a longitudinal direction with a line width of 0.1 mm and a line spacing of 0.33 mm.

A green filter material (Color Mosaic CG-7001 made by Fujifilm Arch Co., Ltd.) was applied using spin coating onto the transparent glass substrate 1 on which the blue color filter layers 2B had been formed, and then patterning was carried out by photolithography, to form green color filter layers 2G of thickness 2 μm in a pattern of lines running in the longitudinal direction with a line width of 0.1 mm and a line spacing of 0.33 mm.

A red filter material (Color Mosaic CR-7001 made by Fujifilm Arch Co., Ltd.) was applied using spin coating, and then patterning was carried out by photolithography, to form red color filter layers 2R of thickness 2 μm in a pattern of lines running in the longitudinal direction with a line width of 0.1 mm and a line spacing of 0.33 mm.

A fluorescent color-converting colorant solution was prepared by dissolving Coumarin 6 (0.1 parts by mass), Rhodamine 6G (0.3 parts by mass) and Basic Violet 11 (0.3 parts by mass) in a propylene glycol monoethyl acetate solvent (120 parts by mass). An amount of 100 parts by mass of a photopolymerizable resin 'V259PA/P5' (trade name, Nippon Steel Chemical Co., Ltd.) was added to the solution and dissolved, to obtain a coating liquid. The coating liquid was applied by spin coating, and drying was carried out by heating, to form a colorant layer 3 of thickness 7 μm. Here, the Coumarin 6 is a green color-converting colorant, and the Rhodamine 6G and the Basic Violet 11 are red color-converting colorants.

A carbon arc lamp (white light source) disposed on the side of transparent substrate 1 was used for exposure. The intensity of the light at the surface of the transparent substrate 1 was 1 W/cm$^2$. Here, samples comprising glass substrate 1 with color filter layers 2 and colorant layer 3 formed thereon were formed separately, and the photodecomposition behavior of the color-converting colorants in the samples was studied. The time required for the absorption strength of the colorants to drop to 1/10 of the original value was used as the exposure time in the present example. As a result of the exposure, red color-converting layers 4R containing the Rhodamine 6G and the Basic Violet 11 were formed on red color filter layers 2R, and green color-converting layers 4G containing the Coumarin 6 were formed on green color filter layers 2G. All of the colorants in colorant layer 3 were decomposed in regions above blue color filter layers 2B and in regions where no color filter layer had been provided.

In the color-converting filter thus obtained, color-converting layers 4R and 4G were formed in the positions of corresponding color filter layers 2R and 2G, and misshaping or the like of the color-converting layers was not observed.

EXAMPLE 2

A black mask material (Color Mosaic CK-7000 made by Fujifilm Arch Co., Ltd.) was applied by spin coating onto transparent substrate 1, and then patterning was carried out by photolithography, to obtain black mask 6 of thickness 1.5 μm having therein a plurality of openings each of size 0.33 mm (longitudinal direction)×0.09 mm (transverse direction). The spacing between the openings was made to be 0.03 mm in both the longitudinal and transverse directions.

A blue filter material (Color Mosaic CB-7001 made by Fujifilm Arch Co., Ltd.) was applied by spin coating, and patterning was carried out by photolithography, to form blue color filter layers 2B of thickness 2 μm in a pattern of lines running in the longitudinal direction with a line width of 0.1 mm and a line spacing of 0.33 mm.

A green filter material (Color Mosaic CG-7001 made by Fujifilm Arch Co., Ltd.) was applied using spin coating onto transparent substrate 1 on which blue color filter layers 2B had been formed, and then patterning was carried out with photolithography, to form green color filter layers 2G of thickness 2 μm in a pattern of lines running in the longitudinal direction with a line width of 0.1 mm and a line spacing of 0.33 mm.

A red filter material (Color Mosaic CR-7001 made by Fujifilm Arch Co., Ltd.) was applied using spin coating, and then patterning was carried out with photolithography, to form red color filter layers 2R of thickness 2 μm in a pattern of lines running in the longitudinal direction with a line width of 0.1 mm and a line spacing of 0.33 mm.

A fluorescent color-converting colorant solution was prepared by dissolving Coumarin 6 (0.1 parts by mass), Rhodamine 6G (0.3 parts by mass) and Basic Violet 11 (0.3 parts by mass) in a propylene glycol monoethyl acetate solvent (120 parts by mass). An amount of 100 parts by mass of a photopolymerizable resin 'V259PA/P5' (trade name, Nippon Steel Chemical Co., Ltd.) was added to the solution and dissolved, thus obtaining a coating liquid. The coating liquid was applied by spin coating, and drying was carried out by heating, to form colorant layer 3 of thickness 7 μm. Here, the Coumarin 6 is a green color-converting colorant, and the Rhodamine 6G and the Basic Violet 11 are red color-converting colorants.

A carbon arc lamp (white light source) disposed on the side of transparent substrate 1 was used for exposure. The intensity of the light at the surface of the transparent substrate 1 was 1 W/cm$^2$. Here, samples comprising glass substrate 1 with color filter layers 2 and colorant layer 3 formed thereon were formed separately, and the photodecomposition behavior of the color-converting colorants in the samples was studied. The time taken for the absorption strength of the colorants to drop to 1/10 of the original value was then used as the exposure time. As a result of the exposure, red color-converting layers 4R containing the Rhodamine 6G and the Basic Violet 11 were formed on red color filter layers 2R, and green color-converting layers 4G containing the Coumarin 6 were formed on green color filter layers 2G. All of the colorants were decomposed in layers 4B above blue color filter layers 2B.

In the color-converting filter obtained, pixels having dimensions of 0.36 mm×0.36 mm including the black mask were arranged in a matrix, with each pixel being constituted from red, green and blue sub-pixels each of dimensions 0.33 mm (longitudinal direction)×0.09 mm (transverse direction).

Aluminum to a thickness of 500 nm and IZO to a thickness of 100 nm were formed by sputtering using a mask on glass substrate 10 on which TFTs 11 and insulating flattening film 12 having therein an opening at a source electrode part for each of the TFTs had been provided in advance, thus forming first electrode 13 divided into a plurality of parts corresponding one-to-one to TFTs 11. The parts of first electrode 13 each had dimensions of 0.33 mm (longitudinal direction)×0.09 mm (transverse direction), and were arranged in a matrix with a spacing of 0.03 mm in both the longitudinal and transverse directions.

The substrate on which first electrode 13 had been formed was installed in a resistive heating vapor deposition apparatus, and organic EL layer 14 was formed. Organic EL layer 14 had a four-layer structure comprising a hole injection layer, a hole transport layer, an organic light-emitting layer, and an electron injection layer. To form organic EL layer 14, the pressure inside the vacuum chamber was reduced down to $1\times10^{-4}$ Pa, and without releasing the vacuum, copper phthalocyanine (CuPc, hole injection layer) was formed to a thickness of 100 nm, 4,4'-bis[N-(1-naphthyl)-N-phenylamino]biphenyl (α-NPD, hole transport layer) was formed to a thickness of 20 nm, 4,4'-bis(2,2'-diphenylvinyl)biphenyl (DPVBi, organic light-emitting layer) was formed to a thickness of 30 nm, and aluminum tris(8-quinolinolate) (Alq, electron injection layer) was formed to a thickness of 20 nm, thus obtaining organic EL layer 14. Without releasing the vacuum, Mg/Ag (mass ratio 10:1) to a thickness of 10 nm and IZO to a thickness of 10 nm next were deposited, to form second electrode 15.

Finally, a passivation layer made of $SiO_2$ was formed to a thickness of 500 nm so as to cover the structure from the second electrode 15 down, thus obtaining an organic EL light emitter.

Next, the color-converting filter was conveyed into a glove box in which the moisture concentration and the oxygen concentration both were controlled to 1 ppm. An ultraviolet curing type adhesive (made by Three Bond, trade name 30Y-437) having beads of diameter 20 μm dispersed therein was then applied as outer periphery sealing layer 21 onto outer peripheral parts of transparent substrate 1 of the color-converting filter using a dispenser robot. The color-converting filter and the organic EL light emitter were then bonded together while carrying out alignment, thus forming an assembly. Irradiation with 100 mW/cm² of ultraviolet radiation was then carried out for 30 seconds using a UV lamp, thus curing the outer periphery sealing layer 21 and obtaining an EL display.

As demonstrate, according to the manufacturing method of the present invention, highly detailed color-converting layers can be formed through self-alignment using color filter layers as masks. According to the present invention, the need for patterning the color-converting layers through photolithography is eliminated, and hence the manufacturing process can be shortened. Furthermore, color-converting layers having increased thickness are formed integrally with a flattening layer, so that even if color-converting layers having a width that is narrow compared with the film thickness are formed, misshaping of the color-converting layers can be suppressed. According to the method of the present invention, a color-converting filter that can be used in a microdisplay, e.g., as a video camera viewfinder, can thus be manufactured.

What is claimed is:

1. A method of manufacturing a color-converting filter, comprising:

forming color filter layers on a transparent substrate;

forming a colorant layer containing a color-converting colorant on said color filter layers; and exposing said colorant layer through said transparent substrate and said color filter layers using colorant-decomposing light to form color-converting layers in positions corresponding to said color filter layers;

wherein said color-converting colorant is decomposed by light outside a wavelength region transmitted by said color filter layers;

said colorant-decomposing light contains a wavelength component that decomposes said color-converting colorant; and said color-converting layers emit, through wavelength distribution conversion, light that will be transmitted by said color filter layers.

2. The method of manufacturing a color-converting filter according to claim 1, wherein said colorant-decomposing light is white light.

3. A method of manufacturing a color-converting filter, comprising:

forming color filter layers of n types on a transparent substrate;

forming a colorant layer containing color-converting colorants of n−1 types on said color filter layers of the n types; and exposing said colorant layer through said transparent substrate and said color filter layers using colorant-decomposing light, to form color-converting layers of an $m^{th}$ type in positions corresponding to said color filter layers of the $m^{th}$ type;

wherein n represents an integer from 2 to 6, and m takes on the values of all integers from 1 to n−1;

each of the n types of said color filter layers transmits light in a different wavelength region;

the $m^{th}$ type of said color-converting colorants is decomposed by light not transmitted by said color filter layers of the $m^{th}$ type; and said color-converting layers of the $m^{th}$ type emit, through wavelength distribution conversion, light that will be transmitted by said color filter layers of the $m^{th}$ type.

4. The method of manufacturing a color-converting filter according to claim 3, wherein said color filter layers of the $(m+1)^{th}$ type transmit light of a shorter wavelength than said color filter layers of the $m^{th}$ type, and the $m^{th}$ type of said color-converting colorants is decomposed by light of a shorter wavelength than the light transmitted by said color filter layers of the $m^{th}$ type.

5. The method of manufacturing a color-converting filter according to claim 4, wherein said colorant-decomposing light contains wavelength components that together decompose all of the n−1 types of said color-converting colorants.

6. The method of manufacturing a color-converting filter according to claim 4, wherein exposure is carried out a plurality of times, and a wavelength component that decomposes the $m^{th}$ type of said color-converting colorants is contained in the colorant-decomposing light used in at least one of the plurality of exposures.

7. The method of manufacturing a color-converting filter according to claim 3, wherein said colorant-decomposing light contains wavelength components that together decompose all of the n−1 types of said color-converting colorants.

8. The method of manufacturing a color-converting filter according to claim 7, wherein said colorant-decomposing light is white light.

9. The method of manufacturing a color-converting filter according to claim 8, wherein exposure is carried out n−1 times, and the $m^{th}$ exposure is carried out using light containing the wavelength component that decomposes the $m^{th}$ type of said color-converting colorants.

10. The method of manufacturing a color-converting filter according to claim 3, wherein exposure is carried out a plurality of times, and a wavelength component that decomposes the $m^{th}$ type of said color-converting colorants is contained in the colorant-decomposing light used in at least one of the plurality of exposures.

11. The method of manufacturing a color-converting filter according to claim 3, wherein said colorant layer further contains an $n^{th}$ type of color-converting colorant, color-converting layers of the $n^{th}$ type are formed through exposure in positions corresponding to said color filter layers of the $n^{th}$ type, the $n^{th}$ type of said color-converting colorants is decomposed by light not transmitted by said color filter layers of the $n^{th}$ type, and the $n^{th}$ type of said color-converting colorants emits, through wavelength distribution conversion, light that will be transmitted by said color filter layers of the $n^{th}$ type.

12. The method of manufacturing a color-converting filter according to claim 11, wherein said color filter layers of the $(m+1)^{th}$ type transmit light of a shorter wavelength than said color filter layers of the $m^{th}$ type, the $m^{th}$ type of said color-converting colorants is decomposed by light of a shorter wavelength than the light transmitted by said color filter layers of the $m^{th}$ type, and the $n^{th}$ type of said color-converting colorants is decomposed by light of a shorter wavelength than the light transmitted by said color filter layers of the $n^{th}$ type.

13. The method of manufacturing a color-converting filter according to claim 12, wherein said colorant-decomposing light contains wavelength components that together decompose all of the n−1 types of said color-converting colorants.

14. The method of manufacturing a color-converting filter according to claim 13, wherein said colorant-decomposing light is white light containing a near ultraviolet component.

15. The method of manufacturing a color-converting filter according to claim 12, wherein exposure is carried out a plurality of times, and a wavelength component that decomposes the $k^{th}$ type of said color-converting colorants is contained in the colorant-decomposing light used in at least one of the plurality of exposures, wherein k takes on the values of all integers from 1 to n.

16. The method of manufacturing a color-converting filter according to claim 11, wherein exposure is carried out a plurality of times, and a wavelength component that decomposes the $k^{th}$ type of said color-converting colorants is contained in the colorant-decomposing light used in at least one of the plurality of exposures, wherein k takes on the values of all integers from 1 to n.

17. The method of manufacturing a color-converting filter according to claim 16, wherein exposure is carried out n times, and the $k^{th}$ exposure is carried out using light containing the wavelength component that decomposes the $k^{th}$ type of said color-converting colorants.

\* \* \* \* \*